United States Patent [19]

Sukeda et al.

[11] Patent Number: 4,485,458
[45] Date of Patent: Nov. 27, 1984

[54] CASSETTE-TYPE MAGNETIC BUBBLE MEMORY DEVICE

[75] Inventors: Toshiaki Sukeda, Suzaka; Harumi Maekawa, Kawasaki; Sakan Takai, Suzaka, all of Japan

[73] Assignee: Fujitsu Limited, Tokyo, Japan

[21] Appl. No.: 274,543

[22] Filed: Jun. 17, 1981

[30] Foreign Application Priority Data

Jun. 20, 1980 [JP] Japan .................................. 55-82801
Jun. 20, 1980 [JP] Japan ............................. 55-85573[U]
Jun. 20, 1980 [JP] Japan ............................. 55-85574[U]

[51] Int. Cl.³ ............................................. G11C 19/08
[52] U.S. Cl. ...................................................... 365/1
[58] Field of Search .................. 365/1, 97, 55, 63, 66, 365/52; 360/137

[56] References Cited

U.S. PATENT DOCUMENTS 3,447,037  5/1969  Nissim .
3,521,010  7/1970  Sato ..................................... 360/137

FOREIGN PATENT DOCUMENTS 0043427  4/1979  Japan ...................................... 365/2

OTHER PUBLICATIONS

IBM Technical Disclosure Bulletin–vol. 14, No. 10, Mar. 1972, pp. 2896–2897.

*Primary Examiner*—James W. Moffitt
*Attorney, Agent, or Firm*—Staas & Halsey

[57] ABSTRACT

A magnetic bubble cassette comprising bubble memory devices mounted on a printed board in a case and a connector for connecting said bubble memory devices to an external apparatus, including through another bubble memory device for driving said bubble memory device. The connecting portion of said connector that is connected to the external apparatus is arranged on a peripheral wall parallel to the insertion direction of said cassette into said external apparatus. This configuration, allowing a plurality of magnetic bubble memory devices to be disposed in the cassette, increases memory capacity while improving handling of the cassettes.

9 Claims, 15 Drawing Figures

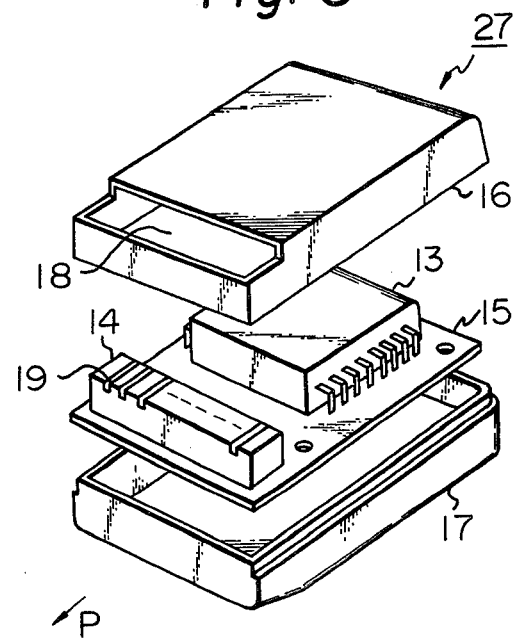
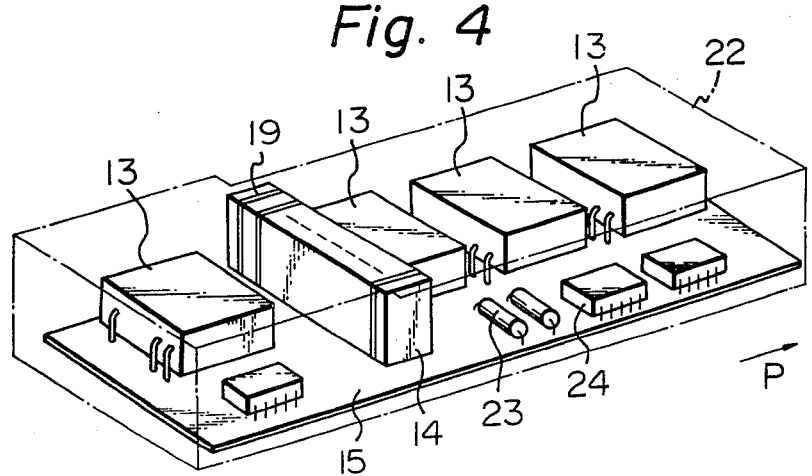

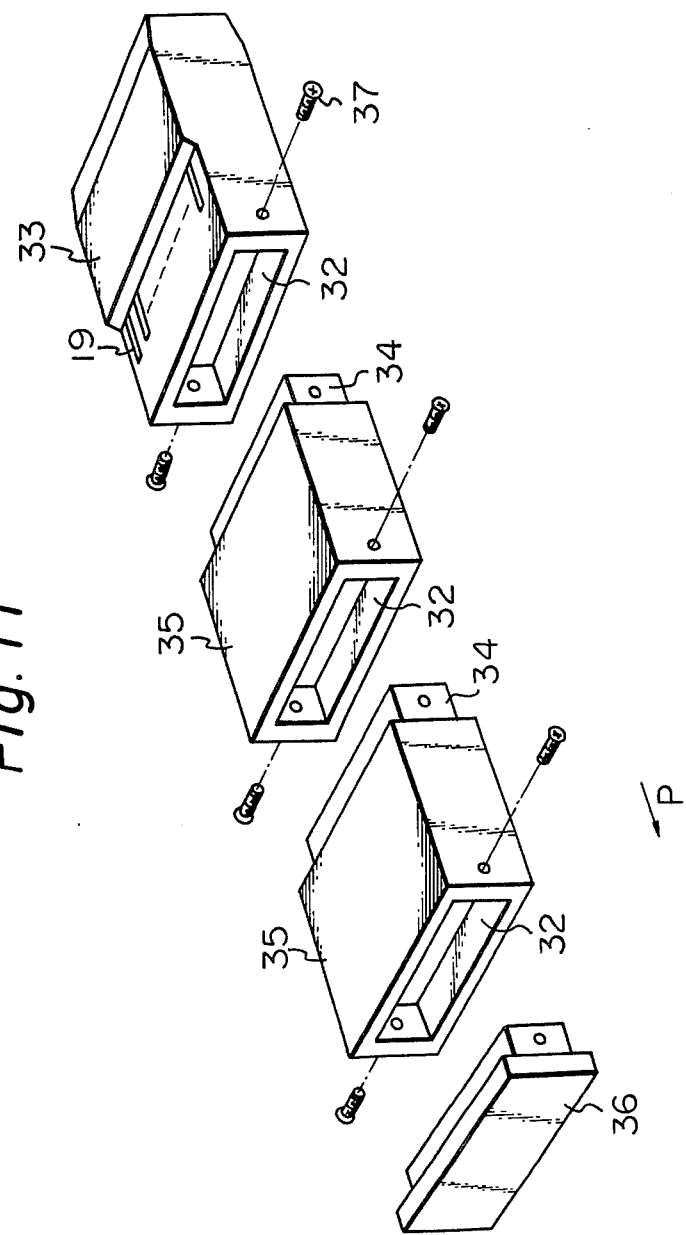

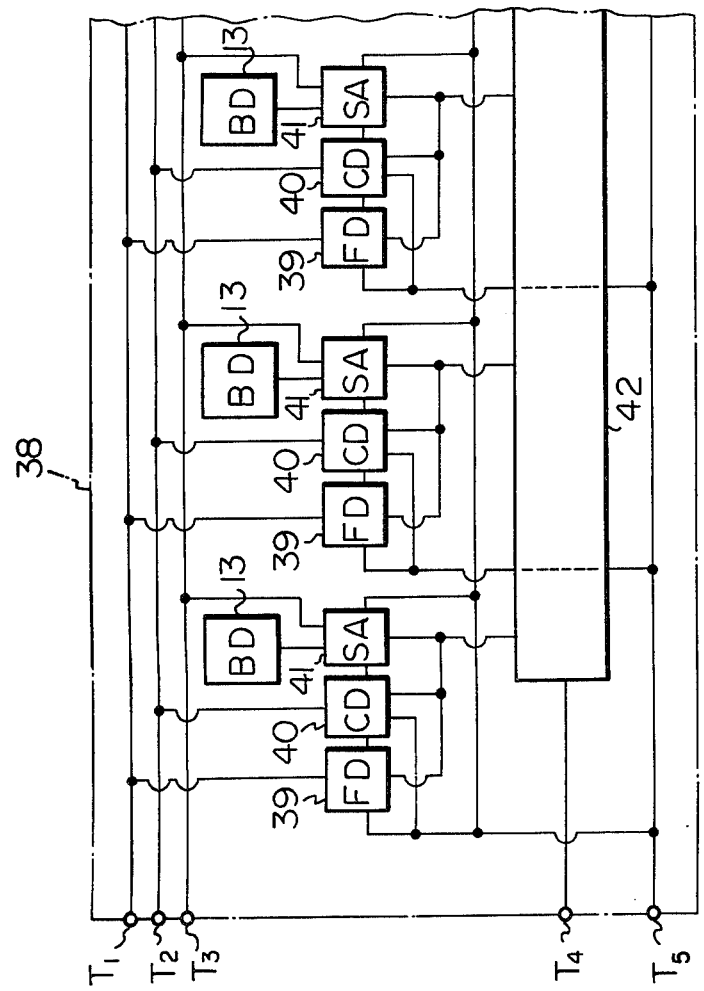

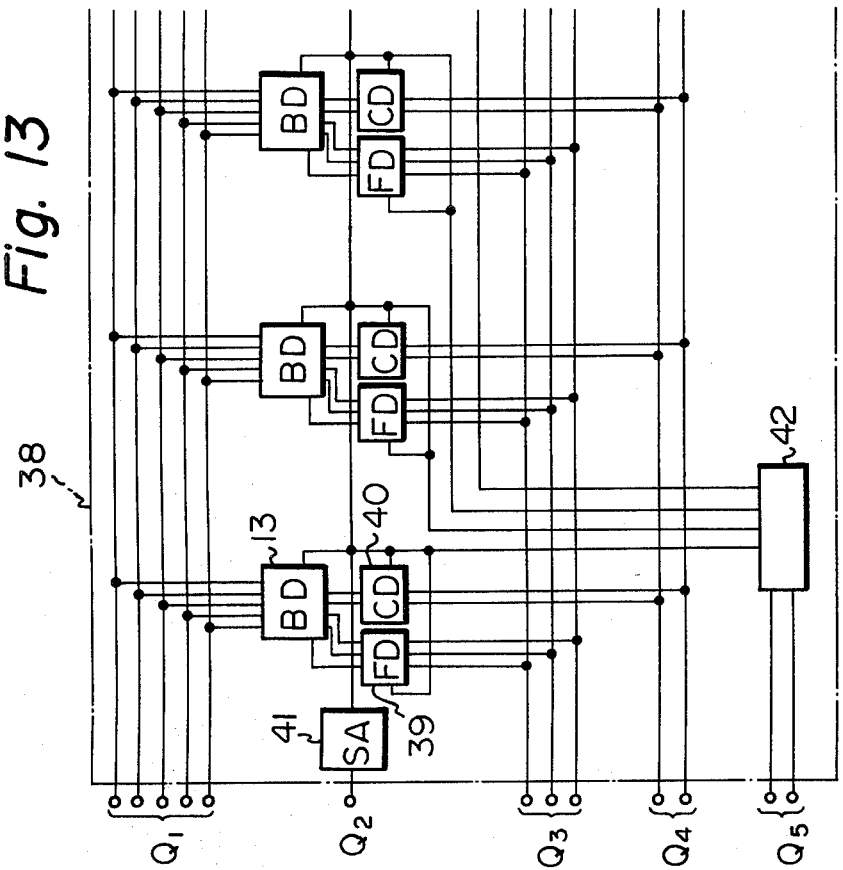

CASSETTE-TYPE MAGNETIC BUBBLE MEMORY DEVICE

BACKGROUND OF THE INVENTION

The present invention relates to an improvement in a magnetic bubble memory device and, more particularly, to a connector for connecting the device to an external apparatus.

A magnetic bubble memory is non-volatile and has various excellent properties. For example, it has a high memory capacity, a small size and reduced consumption of electric power. Accordingly, this magnetic bubble memory is used for magnetic bubble memory devices such as a data recorder and a voice recorder. These magnetic bubble memory devices are used in the form of a cassette removably attached to an external apparatus. In such a magnetic bubble memory device including a bubble cassette, when it is desired to increase the memory capacity of the cassette, the number of devices charged in the cassette can be increased. However, if the number of devices is merely increased, disadvantages described below arise.

If the number of devices is merely increased, the number of input and output terminals of the cassette must be proportionally increased, and therefore, exchangeability of terminals among cassettes differing in memory capacity is lost.

Furthermore, if the number of the devices is increased, the length of the cassette is proportionally increased and the ability to removably attach the cassette to an external apparatus is reduced. For example, when two cassettes differing in size are inserted into one holder, the cassette having a large memory capacity extends out from the holder, and the cassette having a small capacity fits deeply in the holder. Handling of the cassettes is very troublesome and use of such cassettes in one holder becomes impossible.

SUMMARY OF THE INVENTION

The object of the present invention is to eliminate the foregoing disadvantages.

More specifically, in accordance with the present invention, there is provided a magnetic bubble memory device which comprises a cassette and a bubble memory device contained in the cassette case, wherein said cassette comprises a connector for connecting said bubble memory device to an external apparatus, including through other magnetic bubble memory devices, for reading and/or writing and the connecting portion or terminal, connected to the external apparatus, of said connector is mounted on a peripheral wall parallel to the direction of insertion of said cassette into the external apparatus.

In the present invention, the connecting portion of the connector is mounted on the peripheral wall other than the front and rear end faces with respect to the direction of insertion of the cassette into the external apparatus. By virtue of this structure, according to the present invention, the length of the cassette can be increased by increasing the number of bubble memory devices contained in the case without the handling disadvantages mentioned above.

The present invention will now be described in detail with reference to the accompanying drawings.

BRIEF DESCRIPTION OF THE DRAWINGS

FIG. 3 is an exploded perspective view showing one embodiment of the magnetic bubble memory cassette according to the present invention.

FIG. 4 is a perspective view illustrating another embodiment of the magnetic bubble memory cassette according to the present invention.

FIG. 11 is an exploded perspective view illustrating still another embodiment of the magnetic bubble memory cassette according to the present invention.

FIG. 12 is a circuit diagram of the magnetic bubble memory cassette according to the present invention.

FIG. 13 is another circuit diagram of the magnetic bubble memory cassette according to the present invention.

DETAILED DESCRIPTION OF THE PREFERRED EMBODIMENTS

Figure 1A:
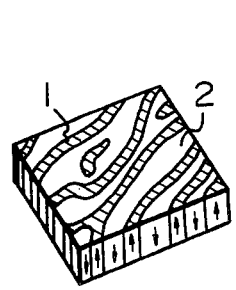
FIG. 1, consisting of a-c, is a diagram illustrating the principle underlying magnetic bubble memory devices.
Figure 1B:
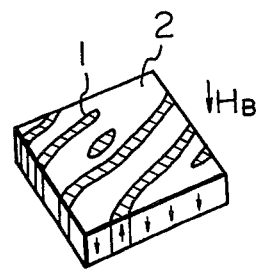
Figure 1C:
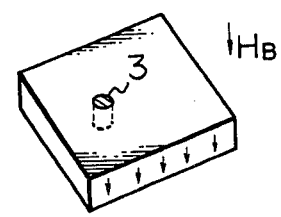
Figure 2:
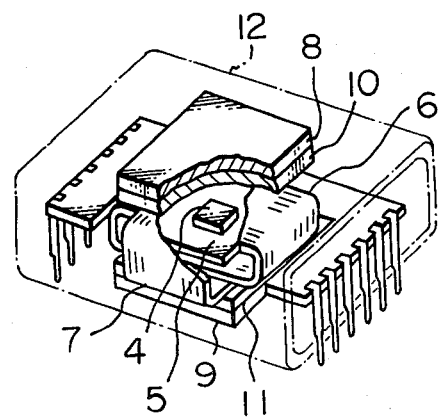
FIG. 2 is a partially cut-away perspective view showing one example of a magnetic bubble memory device.

Magnetic films ordinarily display a magnetization axis of the magnetic domain in the in-plane direction. However, some magnetic materials, for example, single crystals of orthoferrite or magnetic garnet, have such a strong monoaxial anisotropy that an easy magnetization axis is present only in the direction of axis C. When such material having a vertical plane on axis C is formed into a film, if a magnetic field is not applied from the outside, as shown in FIG. 1-(a), magnetic domains 1 of an upward magnetization direction and magnetic domains 2 of a downward magnetization direction are mingled alternately in a striped pattern. The total area of the magnetic domains 1 are substantially equal to the total area of the magnetic domains 2. When a downward bias magnetic field HB is applied to this film, the upward magnetic domains 1 are decreased but the downward magnetic domains 2 are expanded, as shown in FIG. 1-(b), and the upward magnetic domains 1 are finally converted to a small columnar magnetic domain 3 having a diameter of several $\mu$m. This magnetic domain 3 is called "a magnetic bubble domain" and this magnetic domain 3 can freely be moved within the magnetic film according to the gradient of the bias magnetic field. Therefore, this film is utilized as a memory element. An example of a magentic bubble memory device utilizing this magnetic bubble is shown in FIG. 2. This device will now be described in brief.

A chip 4 having a magnetic film is mounted on an insulating substrate 5, and driving coils 6 and 7 are disposed around the chip 4 traversely to each other at a right angle to impart a horizontal rotary magnetic field to the chip 4. Permanent magnets 8 and 9 and magnetic adjuster plates 10 and 11 are arranged above and below the driving coils 6 and 7 to apply a bias magnetic field to the chip 4, and these members are charged in a magnetic shield case 12 also acting as a yoke.

An example of a bubble cassette containing therein a magnetic bubble memory device as described above is illustrated in FIG. 3. The magnetic bubble memory device 13 is mounted on a printed circuit board 15, and a connector 14 for connecting the magnetic bubble memory device 13 to an external apparatus (not shown) for reading and/or writing is disposed on the printed board 15. Many connecting terminals 19 are arranged in parallel on the top surface of the connector 14. This printed board 15 is contained in a case including an upper case 16 and a lower case 17, and a bubble cassette 27 is thus fabricated. This bubble cassette 27 is inserted into an external apparatus (not shown) in a direction indicated by an arrow P. An opening 18 is formed on the top surface of the upper case 16 so that the terminals 19 of the connector 14 are exposed through this opening 18.

Figure 5:
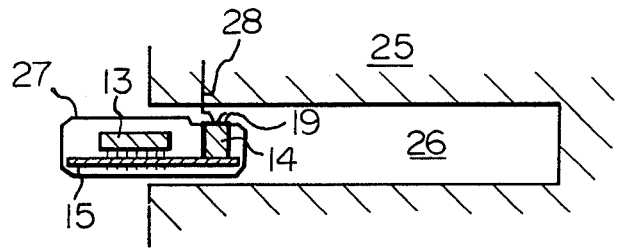
FIG. 5 is a diagram illustrating the case of the magnetic bubble memory cassette shown in FIG. 3 in relation to an external apparatus.

When the bubble cassette 27 is actually used, it is inserted into a holder 26 of an external apparatus 25, as shown in FIG. 5. Contact terminals 28 which have elasticity and which are disposed in parallel in this holder 26 in correspondence to the respective terminals 19, are pressed to contact the corresponding terminals 19 of the connector 14 of the bubble cassette, whereby the bubble cassette 27 is electrically connected to the external apparatus 25.

If increased memory capacity of such a magnetic bubble memory cassette is desired, this object can be attained by increasing the number of bubble memory devices 13 mounted on the printed board 15. A bubble cassette having a memory capacity thus increased is illustrated in FIG. 4. Four bubble memory devices 13, the connector 14, an electronic bubble memory selecting means 23 and an electronic bubble memory driving means 24 are disposed on the printed board 15. This bubble cassette 22 is different from the cassette shown in FIG. 3 in that three additional bubble memory devices 13 are mounted in front of the connector 14 with respect to the insertion direction P.

Figure 6:
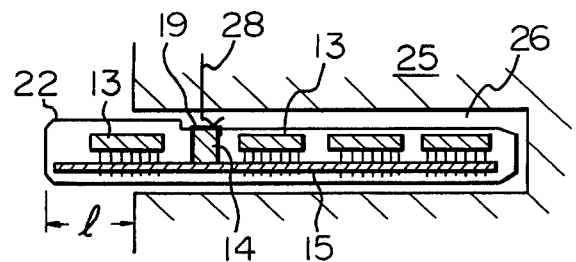
FIG. 6 is a diagram illustrating the use of the magnetic bubble memory cassette shown in FIG. 4 in relation to an external apparatus.

As shown in FIG. 6, this bubble cassette 22 is inserted in the holder 26 of the external apparatus 25 and is used in this positions. As is seen from FIG. 6, the length l of the bubble cassette 22 projecting from the front surface of the external apparatus is the same as in the case of the bubble cassette shown in FIG. 5. By appropriately setting the length of the holder 26, the position of the connector 14 in the bubble cassette and the positions of the contact terminals 28 in the holder, the length l can be adjusted to a length most suitable for the operations of inserting and withdrawing the cassette. In other words, even if the entire length of the cassette is changed by increasing or decreasing the number of the bubble memory devices 13, the operation adaptability of the cassette is not impaired.

Figure 7:
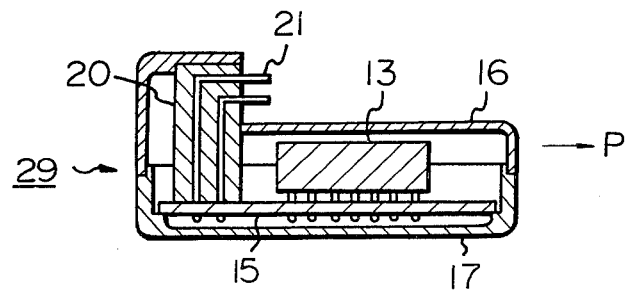
FIG. 7 is a sectional view illustrating still another embodiment of the magnetic bubble memory cassette according to the present invention.

FIG. 7 is a sectional view showing another embodiment of the magnetic bubble memory cassette acording to the present invention. In this embodiment, a plug/jack connector of the insertion type is used instead of the connector of the press-contact type used in the foregoing embodiments. Referring to FIG. 7, a magnetic bubble memory device 13 and a connector 20 are disposed on a printed board 15, and this assembly is contained between upper and lower cases 16 and 17, respectively. The connector 20 is disposed at the rear end portion, with respect to the insertion direction indicated by an arrow P, of the cassette 29 and projects from the top surface of the cassette. A plug 21 of the connector 20 is arranged in the direction of insertion into the external apparatus and is directed thereto. In the embodiment shown in FIG. 7, one bubble memory device 13 is disposed. When an increase in the memory capacity is desired, the printed board 15 and cases 16 and 17 are increased in length and a plurality of bubble memory devices 13 are disposed there-among.

Figure 8:
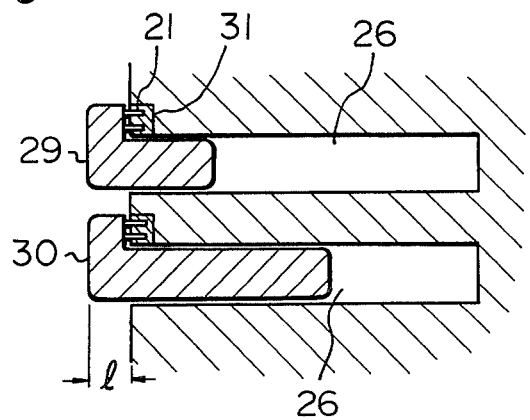
FIG. 8 is a diagram illustrating the use of the magnetic bubble memory cassette shown in FIG. 7 in relation to an external apparatus.

The cassette of this embodiment having the above-mentioned structure is inserted in a holder 26 of the external apparatus as shown in FIG. 8, and the cassette is used in this state. In case of either a cassette 29 having a small capacity, or the cassette 30 having a large capacity, the plug 21 is connected to a jack 31 mounted on the holder 26. Accordingly, the projection length l from the holder 26 is the same in these cassettes 29 and 30 irrespective of the memory capacity. Removable attachment of the cassettes is thus improved and maintained in the respective cassettes.

Figure 9:
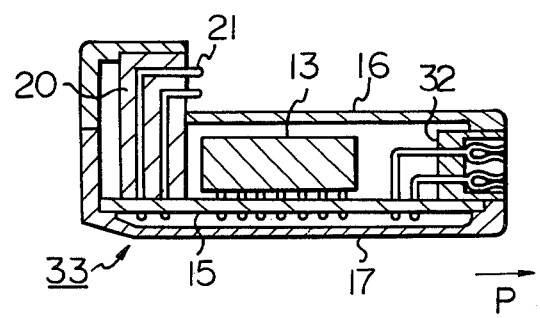
FIG. 9 is a sectional view showing still another embodiment of the magnetic bubble memory cassette according to the present invention.
Figure 10:
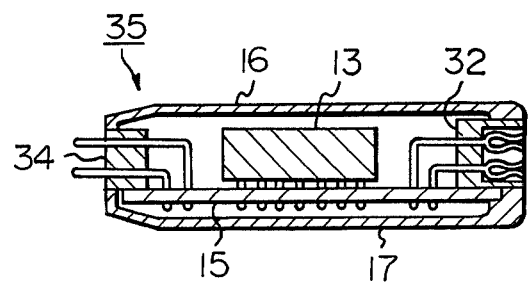
FIG. 10 is a sectional view showing an extension cassette to be attached to the magnetic bubble memory cassette shown in FIG. 9.

Embodiments of means for increasing the number of bubble memory devices, and thus the memory capacity in the magnetic bubble memory device according to the present invention are illustrated in FIGS. 9 through 11. In the embodiment shown in FIG. 9, a connector (jack) 32 for increasing the memory capacity is mounted on the front end portion of the cassette with respect to the direction of insertion of the cassette. A connector (plug) 34 of an additional cassette 35 (FIG. 10) is coupled to the jack 32 of the main cassette 33 which has a connector 20 for connection to the external apparatus. One magnetic bubble memory device 13 is mounted on a printed board 15 in this additional cassette 35, and the jack 32 and plug 34 are disposed on the front and rear ends, respectively. If a plurality of additional cassettes 35 having the above-mentioned structure are connected to the front portion of the main cassette, as in the foregoing emobdiments, the memory capacity can easily be increased without degradation of the operation adaptability of the cassettes at the inserting and withdrawing steps.

It is preferred that the additional cassettes 35 be fixed to the main cassette 33 and to one another by screws 37 as shown in FIG. 11. If this arrangement is adopted, the respective additional cassettes are integrated into a cassette assembly and this assembly can be attached to and withdrawn from the external apparatus assuredly without separation of the assembly into the respective cassettes. A lid 36 may be mounted on the jack 32 of the additional cassette 35 located at the front end. The main connector 33 shown in FIG. 11 is of the type provided with a press-contact type connector.

An internal circuit of the bubble cassette according to the present invention is shown in FIG. 12. Referring to FIG. 12, a portion defined by a chain line 38 corresponds to a structural part of the bubble cassette, and in the interior, there are disposed a plurality of magnetic bubble memory devices 13, to each of which a function driver 39, a coil driver 40 and a sensing amplifier 41 are connected. There is also disposed in the cassette a selecting circuit 42 for selecting and driving the bubble devices 13.

The function driver 39 acts as a bubble transmission controlling circuit in the bubble chip for reading and writing information, and the coil driver 40 acts as a circuit for controlling coils X and Y for generating a magnetic field for the movement of bubbles. The sensing amplifier 41 acts as a circuit for converting minute analog signals of bubbles into digital signals "1" or "0".

Each function driver 39 is connected to a function signal terminal T1 of the connector, and each coil driver 40 is connected to a coil signal terminal T2. Each sensing amplifier 41 is connected to a sensing timing terminal T3 of the connector. Furthermore, the function drivers 39, coil drivers 40 and sensing amplifiers 41 are connected to a power source terminal T5 and the selecting circuit 42 is connected to a selecting signal terminal T4.

When a signal for reading or writing an item of information is applied to the circuit of FIG. 12, one bubble device 13 is selected by the selecting circuit 42 and the function driver 39, coil driver 40 and sensing amplifier 41 connected to this selected device are actuated.

The embodiment having the above-mentioned structure includes, in the bubble cassette thereof, peripheral circuits disposed in the external apparatus according to the conventional techniques, such as function drivers, coil drivers, sensing amplifiers and selecting circuits, and therefore, in the present embodiment, even if the number of bubble devices is increased in one cassette, the number of connection terminals to the external apparatus is not changed and cassette exchangeability is conveniently attained.

FIG. 13 shows another embodiment of the internal circuit of the bubble cassette according to the present invention. In this embodiment, one sensing amplifier 41 is commonly used for the respective bubble devices 13. In FIG. 13, Q1, Q2, Q3, Q4 and Q5 represent a power source terminal, a sensing signal terminal, a function signal terminal, a coil driver signal terminal and a selecting signal terminal, respectively.

As will be apparent from the foregoing description, exchangeability of bubble cassettes differing in memory capacity is attained according to the present invention, and the present invention makes great contributions to expansion of the application fields and ranges of the magnetic bubble memory device.

In the present invention, connector contact portions are formed on the peripheral wall of the bubble cassette except the front and rear end faces with respect to the insertion direction of the cassette, and function drivers, coil drivers and sensing amplifiers for driving magnetic bubble devices are disposed in the interior of the cassette. Accordingly, the memory capacity can be increased by increasing the number of the magnetic bubble devices without increasing the number of the terminals of the connector. Moreover, even if the length of the cassette is increased by disposition of additional devices, the cassette can easily be handled when used.

We claim:

1. A magnetic bubble cassette, having a case with a front end, a rear end and peripheral walls, the front end being insertable into an external apparatus, the cassette comprising: a bubble memory device mounted on a printed circuit board in the caase and a connector means having a portion for connecting said bubble memory device to the external apparatus for driving said bubble memory device, wherein the connecting portion of said connector means that is connected to the external apparatus is arranged on a peripheral wall parallel to the insertion direction of said cassette into said external apparatus.

2. A magnetic bubble cassette as set forth in claim 1, wherein said connector means is a press-contact connector.

3. A magnetic bubble cassette as set forth in claim 1, wherein said connector means is a plug/jack connector.

4. A magnetic bubble cassette as set forth in claim 1, further comprising: a function driver means, a coil driver means and a sensing amplifier means mounted on the printed circuit board for driving the bubble memory device, and a selecting circuit means disposed on the printed circuit board for selecting one of the bubble memory devices when more than one bubble memory device are positioned on the printed circuit board.

5. A magnetic bubble cassette as set forth in claim 1, 2 or 3, wherein the bubble memory device comprises a plurality of bubble memory devices mounted on the printed circuit board.

6. A magnetic bubble cassette as set forth in claim 1, 2, or 3, further comprising: a second connector means for connecting additional bubble memory devices contained in additional cassettes and having a connecting portion extending from the front end of the cassette mounted on the printed circuit board, so that additional cassettes having connectors on the ends thereof can further be connected.

7. A magnetic bubble memory cassette of claim 6, further comprising means for securing the case of one cassette to the adjacent case of another cassette when more than one magnetic bubble memory cassettes are connected to each other.

8. A magnetic bubble memory cassette of claim 6, wherein said second connector means is a press-contact connector.

9. A magnetic bubble memory cassette of claim 6, wherein the second connector means is a plug/jack connector.

* * * * *

UNITED STATES PATENT AND TRADEMARK OFFICE
CERTIFICATE OF CORRECTION

PATENT NO. : 4,485,458
DATED : 11/27/84
INVENTOR(S) : SUKEDA ET AL.

It is certified that error appears in the above-identified patent and that said Letters Patent is hereby corrected as shown below: On the title page;

(57)
Line 4, "another" s/b --other--;
Line 5, "device" s/b --devices,--;
Line 6, "device" s/b --devices--.

Col. 2
Line 13, "case" s/b --use--.

Col. 3
Line 51, "positions" s/b --position--.

Col. 4
Line 15, "there-among" s/b --thereamong--;
Line 19, delete "state. In case of either a" and insert --position. Whether there is used the--;
Line 44, "emobdiments" s/b --embodiments--;

Col. 6
Line 9, "caase" s/b --case--.

Signed and Sealed this

Ninth Day of July 1985

[SEAL]

Attest:

DONALD J. QUIGG

Attesting Officer

Acting Commissioner of Patents and Trademarks